(12) United States Patent  (10) Patent No.: US 7,646,039 B2
Zhu et al.  (45) Date of Patent: Jan. 12, 2010

(54) SOI FIELD EFFECT TRANSISTOR HAVING ASYMMETRIC JUNCTION LEAKAGE

(75) Inventors: Huilong Zhu, Poughkeepsie, NY (US); Zhijiong Luo, Carmel, NY (US); Qingqing Liang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 11/830,972

(22) Filed: Jul. 31, 2007

(65) Prior Publication Data

US 2009/0032845 A1 Feb. 5, 2009

(51) Int. Cl.
*H01L 31/072* (2006.01)
*H01L 31/109* (2006.01)
*H01L 31/0328* (2006.01)
*H01L 31/0336* (2006.01)

(52) U.S. Cl. .................. 257/192; 257/187; 257/197; 438/163; 438/170

(58) Field of Classification Search ........... 257/187, 257/192, 197, E21.403, E29.246; 438/163, 438/170, 174
See application file for complete search history.

(56) References Cited

U.S. PATENT DOCUMENTS

2006/0186505 A1* 8/2006 Adkisson et al. ............ 257/463
2007/0001162 A1* 1/2007 Orlowski et al. ............ 257/19

* cited by examiner

*Primary Examiner*—Phuc T Dang
(74) *Attorney, Agent, or Firm*—Scully, Scott, Murphy & Presser, P.C; DAniel H. Schnurmann

(57) ABSTRACT

A source trench and a drain trench are asymmetrically formed in a top semiconductor layer comprising a first semiconductor in a semiconductor substrate. A second semiconductor material having a narrower band gap than the first semiconductor material is deposited in the source trench and the drain trench to form a source side narrow band gap region and a drain side narrow band gap region, respectively. A gate spacer is formed and source and drain regions are formed in the top semiconductor layer. A portion of the boundary between an extended source region and an extended body region is formed in the source side narrow band gap region. Due to the narrower band gap of the second semiconductor material compared to the band gap of the first semiconductor material, charge formed in the extended body region is discharged through the source and floating body effects are reduced or eliminated.

13 Claims, 12 Drawing Sheets

US 7,646,039 B2

SOI FIELD EFFECT TRANSISTOR HAVING ASYMMETRIC JUNCTION LEAKAGE

FIELD OF THE INVENTION

The present invention relates to semiconductor devices, and particularly, to a semiconductor-on-insulator (SOI) metal oxide semiconductor field effect transistor (MOSFET) having asymmetric junction leakage and methods of manufacturing the same.

BACKGROUND OF THE INVENTION

Metal oxide semiconductor field effect transistors (MOSFETs) built on a semiconductor-on-insulator (SOI) substrate in general offer advantages over a MOSFET with comparable dimensions that is built on a bulk substrate by providing a higher on-current and lower parasitic capacitance between the body and other MOSFET components. However, a MOSFET built on an SOI substrate tends to have less consistency in the device operation due to "history effect," or "floating body effect," in which the potential of the body, and subsequently, the timing of the turn-on and the on-current of the SOI MOSFET are dependent on the past history of the SOI MOSFET. Furthermore, the level of leakage current also depends on the voltage of the floating body, which poses a challenge in the design of a low power SOI MOSFET.

The body of an SOI MOSFET stores charge which is dependent on the history of the device, hence becoming a "floating" body. As such, SOI MOSFETs exhibit threshold voltages which are difficult to anticipate and control, and which vary in time. The body charge storage effects result in dynamic sub-threshold voltage (sub-Vt) leakage and threshold voltage (Vt) mismatch among geometrically identical adjacent devices.

One exemplary semiconductor device in which the floating body effects in SOI MOSFETs are particularly a concern is a static random access memory (SRAM) cell, in which Vt matching is extremely important as operating voltages continue to scale down. The floating body also poses leakage problems for pass gate devices. Another exemplary semiconductor device in which the floating body effects are a concern is a stacked SOI MOSFET structure, as used in logic gates, in which the conductive state of SOI MOSFET devices higher up in the stack are strongly influenced by stored body charge, resulting in reduced gate-to-source voltage (Vgs) overdrive available to these devices. Yet other exemplary semiconductor device in which control of the floating body effects is critical is a sense amplifier for SRAM circuits and current drivers in a current mirror circuit.

While floating body effects may be reduced by increasing leakage current from the body to the source and drain regions, for example, by increasing halo implant dose, such an approach may increase leakage current between the drain and the source, thus increasing the off-current. Ideally, body to drain leakage should be maintained at a minimum level, while body to source leakage should be controlled at a high enough level to suppress the floating body effects by leaking the charge formed in the floating body region.

In view of the above, there exists a need for a semiconductor-on-insulator (SOI) metal oxide semiconductor filed effect transistor (MOSFET) exhibiting reduced floating body effects and having a low off-current, and methods of manufacturing such an SOI MOSFET.

SUMMARY OF THE INVENTION

The present invention addresses the needs described above by providing an SOI MOSFET structure having asymmetric junction leakage and methods of manufacturing the same.

According to the present invention, an asymmetric disposable spacer is formed on sidewalls of a gate conductor formed on a top semiconductor layer comprising a first semiconductor material in a semiconductor substrate. The asymmetric disposable spacer has a narrower width on a source side than on a drain side. Exposed portions of a top semiconductor layer are etched to form a source trench and a drain trench. A second semiconductor material having a narrower band gap than the first semiconductor material is deposited in the source trench and the drain trench to form a source side narrow band gap region and a drain side narrow band gap region, respectively. Preferably, the second semiconductor material is formed epitaxially on the remaining first semiconductor material in the top semiconductor layer. Selective epitaxy may be employed to avoid formation of the second semiconductor material on dielectric surfaces. The asymmetric disposable spacer is removed and source and drain extension regions are formed. A gate spacer is formed and source and drain regions are formed in the top semiconductor layer. A portion of the boundary between an extended source region, i.e., a collection of regions electrically connected to the source region, and an extended body region, i.e., a collection of regions electrically connected to the body region, is formed in the source side narrow band gap region. The boundary between an extended drain region and the extended body region is formed in a first semiconductor material portion of the top semiconductor layer. Due to the narrower band gap of the second semiconductor material compared to the band gap of the first semiconductor material, a body to source leakage current is greater than a body to drain leakage current. Charge formed in the body is thus discharged through the source and floating body effects are reduced or eliminated.

According to an aspect of the present invention, a semiconductor structure is provided, which comprises:

a top semiconductor layer located in a substrate;

an extended body region including a first semiconductor material extended body portion containing a first semiconductor material and a second semiconductor material extended body portion containing a second semiconductor material, located in the top semiconductor layer, and having a first conductivity type doping, wherein the second semiconductor material has a narrower band gap than the first semiconductor material;

a gate dielectric vertically abutting the first semiconductor material body portion;

a gate electrode vertically abutting the gate dielectric; and an extended source region containing a second semiconductor material source region comprising the second semiconductor material and having a second conductivity type doping, wherein the second conductivity type is the opposite of the first conductivity type, and wherein the second semiconductor material source region abuts the second semiconductor material body portion.

In one embodiment, the substrate is a semiconductor-on-insulator layer comprising the top semiconductor layer, a buried insulator layer vertically abutting the top semiconductor layer, and a handle substrate vertically abutting the buried insulator layer, and the extended source region further comprises a bottom first semiconductor material source region containing the first semiconductor material and vertically abutting the buried insulator layer and the second semiconductor material source region.

In another embodiment, the extended source region further comprises a top first semiconductor material source region containing the first semiconductor material and laterally abutting the second semiconductor material source region and vertically abutting a top surface of the top semiconductor layer.

In even another embodiment, the extended source region further comprises a first semiconductor material source extension region containing the first semiconductor material and abutting the top first semiconductor material source region and vertically abutting the top surface of the top semiconductor layer.

In yet another embodiment, the extended source region further comprises a second semiconductor material source extension region containing the second semiconductor material and abutting the second semiconductor material source region and vertically abutting the extended body region.

In still another embodiment, the extended source region further comprises a first semiconductor material source extension region containing the first semiconductor material and laterally abutting the second semiconductor material source extension region and vertically abutting a top surface of the top semiconductor layer.

In still another embodiment, the semiconductor structure further comprises an extended drain region containing a first semiconductor material drain region and a second semiconductor material drain region, wherein the first semiconductor material drain region contains the first semiconductor material and abuts the extended body region, and wherein the second semiconductor material drain region contains the second semiconductor material and is separated from the extended body region by the first semiconductor material drain region.

In a further embodiment, the semiconductor structure further comprises a gate spacer containing a dielectric material, wherein the gate spacer abuts the second semiconductor material source region on one side of the gate electrode, and wherein the gate spacer is disjoined from any second semiconductor material on an opposite side of the gate electrode.

In an even further another embodiment, the semiconductor structure further comprises an extended drain region containing a first semiconductor material drain region and a second semiconductor material drain region, wherein the first semiconductor material drain region contains the first semiconductor material and abuts the gate spacer, and wherein the second semiconductor material drain region contains the second semiconductor material and is separated from gate spacer.

In a yet further embodiment, the extended body region comprises a source side halo region and a drain side halo region, wherein the source side halo region includes a first semiconductor material source side halo region containing the first semiconductor material and a second semiconductor material source side halo region containing the second semiconductor material, and wherein the drain side halo region contains the first semiconductor material.

In a still further embodiment, the first semiconductor material extended body portion comprises the first semiconductor material source side halo region, and wherein the second semiconductor material extended body portion comprises the second semiconductor material source side halo region.

In a still yet further embodiment, the second semiconductor material extended body portion further comprises a second semiconductor material body region vertically abutting the second semiconductor material source side halo region.

In a further another embodiment, the semiconductor structure further comprises:

a first semiconductor material source extension region comprising the first semiconductor material located in the source extension region and having a first depth from a top surface of the top semiconductor layer;

a first semiconductor material source extension region comprising the first semiconductor material located in the top semiconductor layer and having the first depth from the top surface of the top semiconductor layer;

a source side halo region located in the extended body region and having a second depth from the top semiconductor layer, wherein the second depth is greater than the first depth; and a drain side halo region located in the extended body region and having the second depth from the top semiconductor layer.

According to another aspect of the present invention, a method of forming a semiconductor structure comprises:

providing a top semiconductor layer comprising a first semiconductor material in a substrate;

forming a gate conductor on the top semiconductor layer;

forming a source trench on one side of the gate conductor in the top semiconductor layer and a drain trench on an opposite side of the gate conductor in the top semiconductor layer;

forming a source side second semiconductor material region comprising a second semiconductor material in the source trench and a drain side second semiconductor material region comprising the second semiconductor material in the drain trench, wherein the second semiconductor material has a narrower band gap than the first semiconductor material; and forming an extended source region, an extended drain region, and an extended body region in the top semiconductor layer, wherein the extended body comprises a portion of the source side second semiconductor material region and is disjoined from the drain side second semiconductor material region.

In one embodiment, the extended body region has a first conductivity type doping and the extended source region and the extended drain region has a second conductivity type doping, wherein the second conductivity type is the opposite of the first conductivity type.

In another embodiment, the substrate is a semiconductor-on-insulator layer comprising the top semiconductor layer, a buried insulator layer vertically abutting the top semiconductor layer, and a handle substrate vertically abutting the buried insulator layer, and each of the source trench and the drain trench has a bottom surface disjoined from the buried insulator layer and the extended source region and the extended drain region vertically abut the buried insulator layer.

In even another embodiment, the method further comprises:

forming an asymmetric disposable spacer on the gate conductor prior to the forming of the source trench and the drain trench, wherein a thickness of the disposable spacer is less on the one side of the gate conductor than on the opposite side of the gate conductor; and removing the asymmetric disposable spacer after the forming of the source trench and the drain trench.

In yet another embodiment, the forming of the asymmetric disposable spacer comprises:

forming a symmetric disposable spacer on the gate conductor;

implanting germanium ions into a portion of the symmetric disposable spacer on the one side of the gate conductor by an angled implantation; and removing the implanted portion of the symmetric disposable spacer selective to portions not implanted with germanium during the implanting of germanium.

In still another embodiment, the method further comprises forming a gate spacer after the forming of the source side second semiconductor material region and the drain side second semiconductor material region, wherein the gate spacer abuts the source side second semiconductor material region, and wherein the gate spacer is disjoined from the drain side second semiconductor material region.

DETAILED DESCRIPTION OF THE INVENTION

Figure 1:
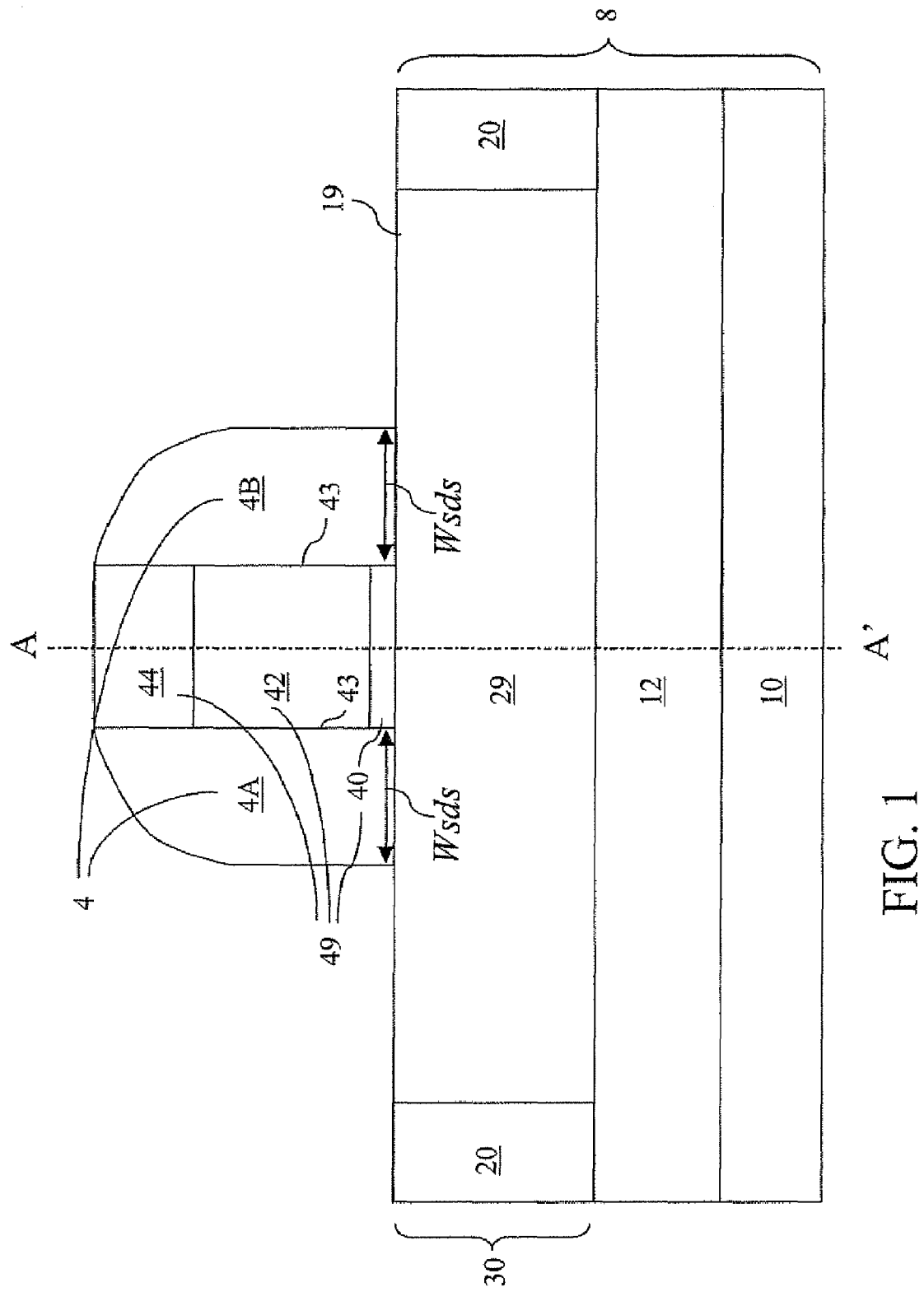
FIGS. 1-10 are sequential vertical cross-sectional views of a first exemplary semiconductor structure according to the present invention.

As stated above, the present invention relates to a semiconductor-on-insulator (SOI) metal oxide semiconductor field effect transistor (MOSFET) having asymmetric junction leakage and methods of manufacturing the same, which are now described in detail with accompanying figures. It is noted that like and corresponding elements are referred to by like reference numerals.

Referring to FIG. 1, a first exemplary semiconductor structure according to the present invention comprises an SOI substrate 8 containing a handle substrate 10, a buried oxide layer 12, and a top semiconductor layer 30. The top semiconductor layer 30 contains shallow trench isolation 20 comprising a dielectric material and a semiconductor region 29 comprising a semiconductor material. The shallow trench isolation 20 abuts the buried insulator layer 12 and laterally surrounds the semiconductor region 29 so that the semiconductor region 29 is electrically isolated from other semiconductor regions (not shown) formed in the top semiconductor layer 30.

The semiconductor region 29 comprises a first semiconductor material. The first semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In an exemplary embodiment, the first semiconductor material comprises silicon. In another exemplary embodiment, thfirst semiconductor material comprises gallium arsenide. The semiconductor region 29 is preferaebly single crystalline. The semiconductor region 29 may be doped with electrical dopants of a first conductivity type. The electrical dopants may be at least one of p-type dopants such as B, Ga, and In. Alternately, the electrical dopants may be at least one of n-type dopants such as P, As, and Sb. The concentration of the electrical dopants may be from about $1.0 \times 10^{15}$ atoms/cm$^3$ to about $1.0 \times 10^{19}$ atoms/cm$^3$. Non-electrical stress-generating dopants such as Ge and/or C may also be present.

The semiconductor region 29 may have a built-in biaxial stress in the plane of the semiconductor region 29, i.e., in the plane perpendicular to the direction of the surface normal of a top surface 19 of the semiconductor region 29. While the present invention is described with the exemplary SOI MOSFET formed on an SOI substrate, the present invention may be implemented on a bulk substrate or on a hybrid substrate. Such variations are explicitly contemplated herein.

A gate stack 49 comprising a gate dielectric 40, a gate conductor 42, and a gate cap dielectric 44 is formed on the semiconductor region 29. Specifically, a stack of a gate dielectric layer (not shown), a gate conductor layer (not shown), and a gate cap dielectric layer (not shown) is formed on the semiconductor region 29 and lithographically patterned and etched. The gate dielectric layer, and consequently the gate dielectric 40, may comprise a conventional dielectric material such as silicon oxide, silicon nitride, silicon oxynitride, and/or a stack thereof. The conventional dielectric material may be formed by thermal conversion of a top portion of the semiconductor region 29 and/or by chemical vapor deposition (CVD). Alternately, the gate dielectric layer may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The high-k dielectric material may be formed by methods well known in the art including, for example, a chemical vapor deposition (CVD), an atomic layer deposition (ALD), molecular beam epitaxy (MBE), pulsed laser deposition (PLD), liquid source misted chemical deposition (LSMCD), etc. The thickness of the gate dielectric layer may be from about 1 nm to about 3 nm in the case of a conventional dielectric material, and from about 2 nm to about 6 nm in the case of the high-k dielectric material, and may have an effective oxide thickness on the order of or less than 1 nm.

The gate conductor layer, and consequently the gate conductor 42, may comprise a semiconductor gate layer and/or a metal gate layer. In the case of the gate dielectric 40 comprising a conventional dielectric material, the gate conductor 42 typically comprises a semiconductor gate layer and has a thickness from about 40 nm to about 200 nm. In the case of the gate dielectric comprising a high-k dielectric material, the gate conductor 42 may comprise a metal gate layer abutting the gate dielectric 40. The metal gate layer may comprise a conductive refractory metal nitride. For example, the metal gate layer may comprise a material such as TaN, TiN, WN, TiAlN, TaCN, other conductive refractory metal nitride, or an alloy thereof. The thickness of the metal gate layer may be from about 5 nm to about 100 nm, and preferably from about 7 nm to about 50 nm. The gate conductor 42 may comprise a stack of a metal gate layer and a semiconductor gate layer. Other materials may be employed for the gate dielectric 40 and/or the gate conductor 42 in addition to the materials described above.

The gate cap dielectric layer, and consequently the gate cap dielectric 44, comprises a dielectric material such as silicon nitride, silicon oxide, or a stack thereof. The thickness of the gate cap dielectric 44 is from about 20 nm to about 150 nm, and typically from about 30 nm to about 120 nm. In an exemplary embodiment, the gate cap dielectric 44 comprises silicon nitride.

The length of the gate conductor 42, i.e., the lateral dimension of the gate conductor 42 in FIG. 1, may be determined by lithographic means, and may be a lithographic minimum length, or a "critical dimension." A trimming etch may be employed to reduce the length of the gate conductor 42 to a length less than the lithographic minimum length as needed.

A disposable spacer 4 is formed on sidewalls 43 of the gate stack 49, which comprises the gate dielectric 40, the gate conductor 42, and the gate cap dielectric 44. The disposable spacer 4 may comprise a semiconductor material, a metal, and/or an insulator material. Preferably, the disposable spacer 4 comprises an insulator material such as silicon nitride. Preferably, the disposable spacer 4 comprises a material different from the shallow trench isolation 20 to subsequently enable removal of the disposable spacer selective to the shallow trench isolation 20.

The disposable spacer 4 is symmetric with respect to the gate stack 49. In other words, a first disposable spacer portion 4A on one side of the gate stack 49 and a second disposable spacer portion 4B on an opposite side of the gate stack 49 have a mirror symmetry around a vertical axis A-A' located midway between the two sidewalls 43 of the gate stack 49 in the plane of FIG. 1. The width of the first disposable spacer portion 4A and the width of the second disposable spacer portion 4B, as measured at the base of each near the top surface 19 of the top semiconductor layer 30, are substantially the same and herein referred to as a symmetric disposable spacer width Wsds, which may be from about 20 nm to about 150 nm, and typically from about 40 nm to about 100 nm. The first disposable spacer portion 4A is located on one side of the gate conductor 42, while the second disposable spacer portion 4B is located on the opposite side of the gate conductor 42.

Figure 2:
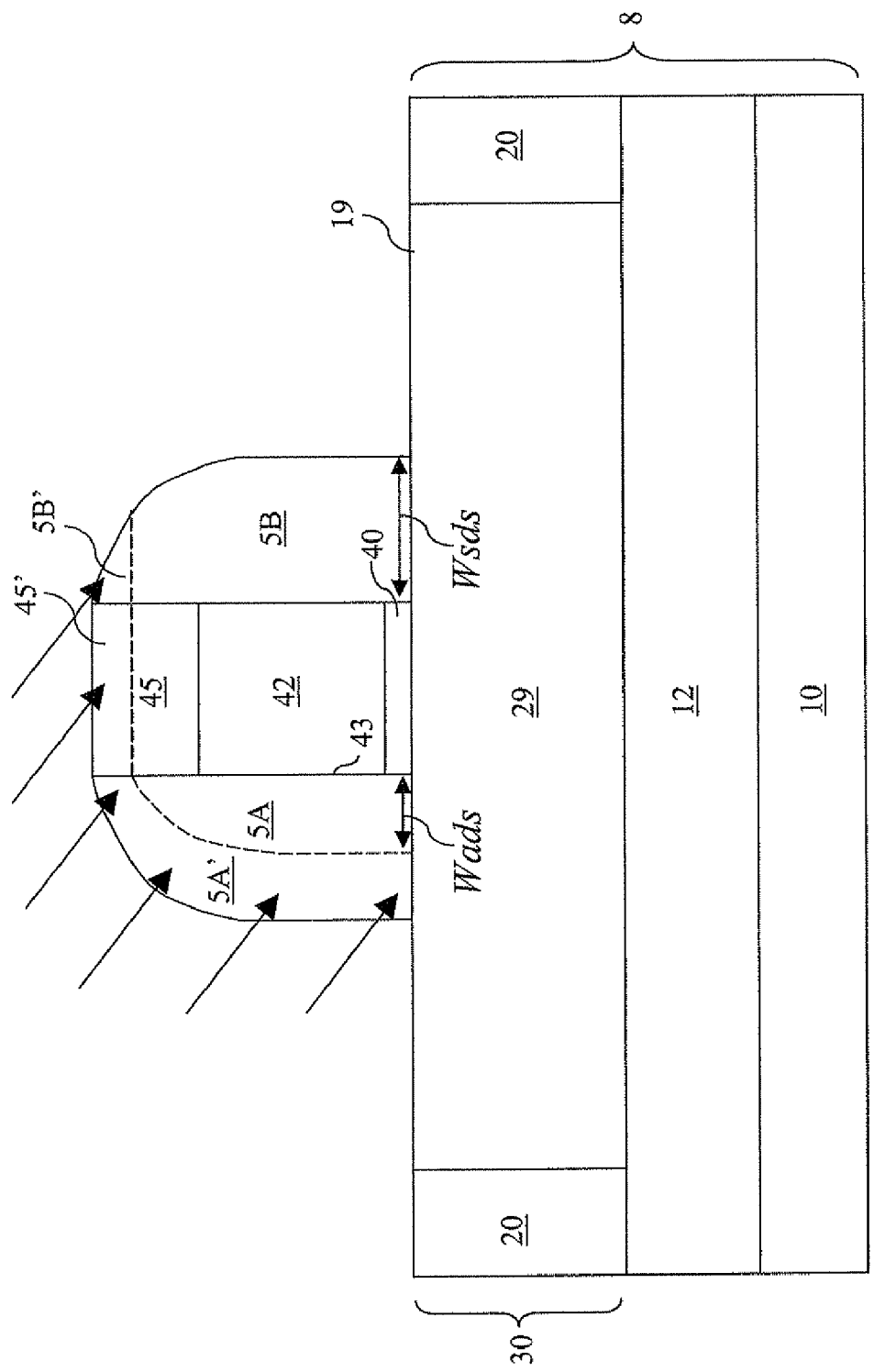

Referring to FIG. 2, germanium ions are implanted into the first disposable spacer portion 4A by angled ion implantation. The direction of the angled ion implantation is shown by a set of parallel arrows. The implanted portion of the first disposable spacer portion 4A is herein referred to as an implanted first disposable spacer portion 5A'. The unimplanted portion of the first disposable spacer portion 4A is herein referred to as an unimplanted first disposable spacer portion 5A. The implanted first disposable spacer portion 5A' abuts the top surface 19 of the top semiconductor layer 30. The angle of the ion implantation is adjusted so that the second disposable spacer portion 4B is implanted with germanium ions only at a top portion which is herein referred to as an implanted second disposable spacer portion 5B', while the portion of the second disposable spacer portion 4B below the height of the bottom surface of the gate cap dielectric 44 is not implanted with the germanium ions. The unimplanted portion of the second disposable spacer portion 4B is herein referred to as an unimplanted second disposable spacer portion 5B. Further, a top portion of the gate cap dielectric 44 is also implanted with germanium ions to become an implanted gate cap dielectric 45', while the unimplanted portion of the gate cap dielectric 44 is herein referred to as an unimplanted gate cap dielectric 45.

The energy of the ion implantation is adjusted so that the germanium ions do not reach the gate conductor 42. An unimplanted first disposable spacer portion 5A has a width, as measured at the base of the unimplanted first disposable spacer portion 5A near the top surface 19 of the top semiconductor layer 30, that is less than the symmetric disposable spacer width Wsds and herein referred to as an asymmetric disposable spacer width Wads. The asymmetric disposable spacer width Wads may be from about 5 nm to about 120 nm, and typically from about 10 nm to about 60 nm.

The implanted portion of the first disposable spacer portion 4A is herein referred to as an implanted first disposable spacer portion 5A'. The dose of the ion implantation is determined such that the implanted first disposable spacer portion 5A', the implanted gate cap dielectric 44', and the implanted second disposable spacer portion 5B' become a high germanium content dielectric material that contains enough germanium to enable a subsequent etch that selectively etches the various implanted portions (5A', 5B', 45') relative to unimplanted portions (5A, 5B) of the disposable spacer 4 and the unimplanted gate cap dielectric 45. For example, the high germanium content dielectric material may have a germanium concentration from about 3% in atomic concentration to about 50% in atomic concentration, and preferably from about 10% in atomic concentration to about 25% in atomic concentration.

Figure 3:
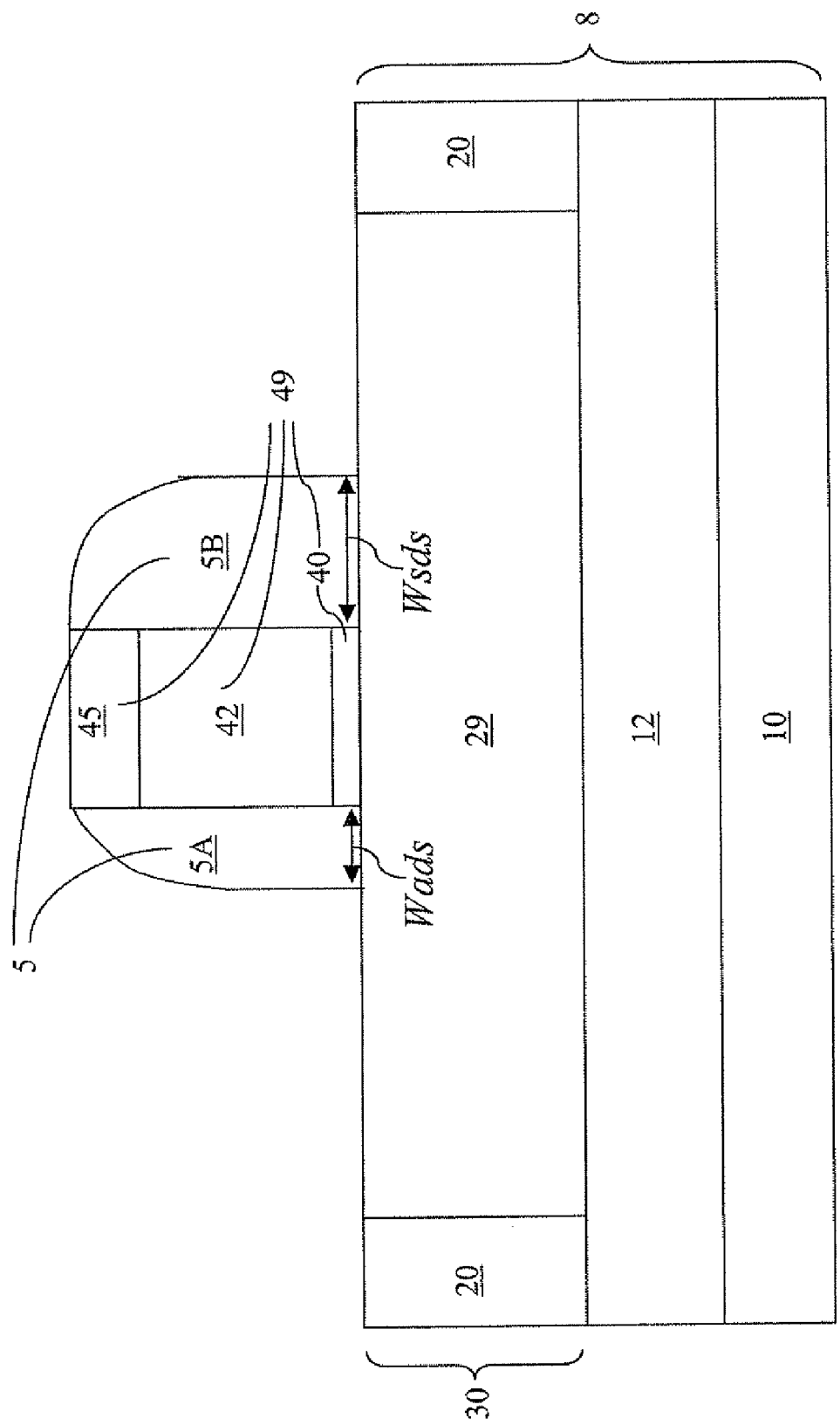

Referring to FIG. 3, the implanted first disposable spacer portion 5A', the implanted gate cap dielectric 44', and the implanted second disposable spacer portion 5B' are etched selective to the unimplanted first disposable spacer portion 5A, the unimplanted second disposable spacer portion 5B, and the unimplanted gate cap dielectric 45. For example, an isotropic reactive ion etch or a wet etch may be employed to removed the high germanium content dielectric material selective to the material of the unimplanted portions (5A, 5B) of the disposable spacer 4 and the unimplanted gate cap dielectric 45.

The unimplanted first disposable spacer portion 5A and the unimplanted second disposable spacer portion 5B collectively constitute an asymmetric disposable spacer 5. The width of the unimplanted first disposable spacer portion 5A is the asymmetric disposable spacer width Wads, while the width of the unimplanted second disposable spacer portion 5B is the symmetric disposable spacer width Wsds, which is greater than the asymmetric disposable spacer width Wads. The asymmetric disposable spacer 5 has different widths on two sides of the gate conductor 42, and therefore, is asymmetric.

Figure 4:
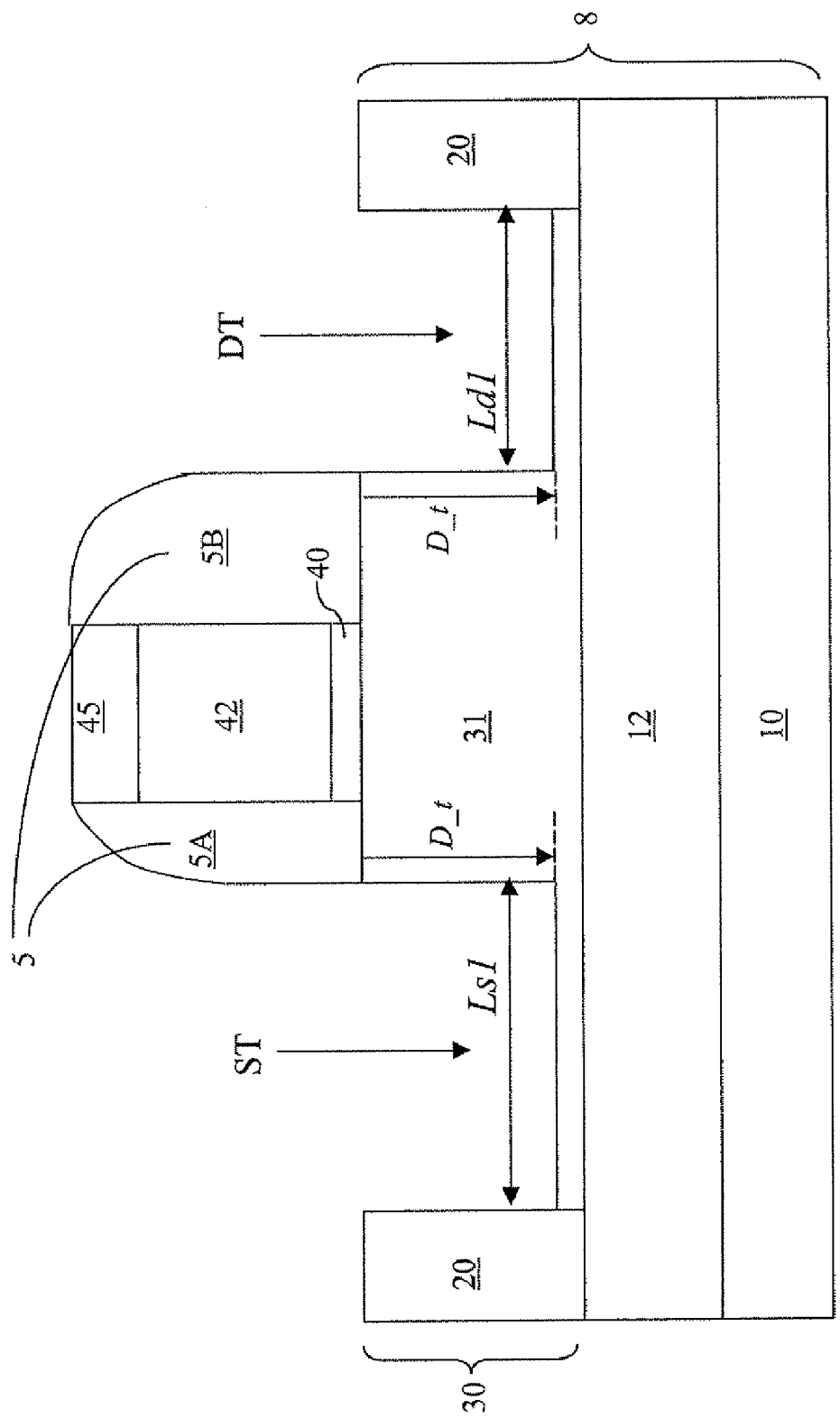

Referring to FIG. 4, a source trench ST and a drain trench DT are formed in the top semiconductor layer 30 by a reactive ion etch employing the unimplanted gate cap dielectric 45, the asymmetric disposable spacer 5, and the shallow trench isolation 20 as an etch mask. The source trench ST is formed adjacent to the unimplanted first disposable spacer portion 5A, while the drain trench DT is formed adjacent to the unimplanted second disposable spacer portion 5B. The remaining portion of the semiconductor region 29 is herein referred to as a first semiconductor material region 31. The first semiconductor material region 31 comprises the first semiconductor material. The first semiconductor material region 31 is preferably single crystalline.

The depth of the source trench ST and the depth of the drain trench DT are substantially the same, and are herein referred to as a depth of trench $D\_t$. The depth of trench $D\_t$ is less than the thickness of the top semiconductor layer 30, i.e., the source trench ST and the depth of the drain trench DT do not reach the buried insulator layer 12. The source trench length Lsl, or the length of the source trench ST in the direction perpendicular to the direction of the gate conductor 42, may be greater than the drain trench length Ldl, or the length of the drain trench DT in the direction perpendicular to the direction of the gate conductor 42. In one embodiment, the source trench length Lsl may be greater than a minimum width necessary for forming a metal contact via, while the drain trench length Ld1 may be less than a minimum width necessary for forming a metal contact via. In another embodiment, the source trench length Ls1 and the drain trench length Ld1 may be at least equal to a minimum width necessary for forming a metal contact via.

Figure 5:
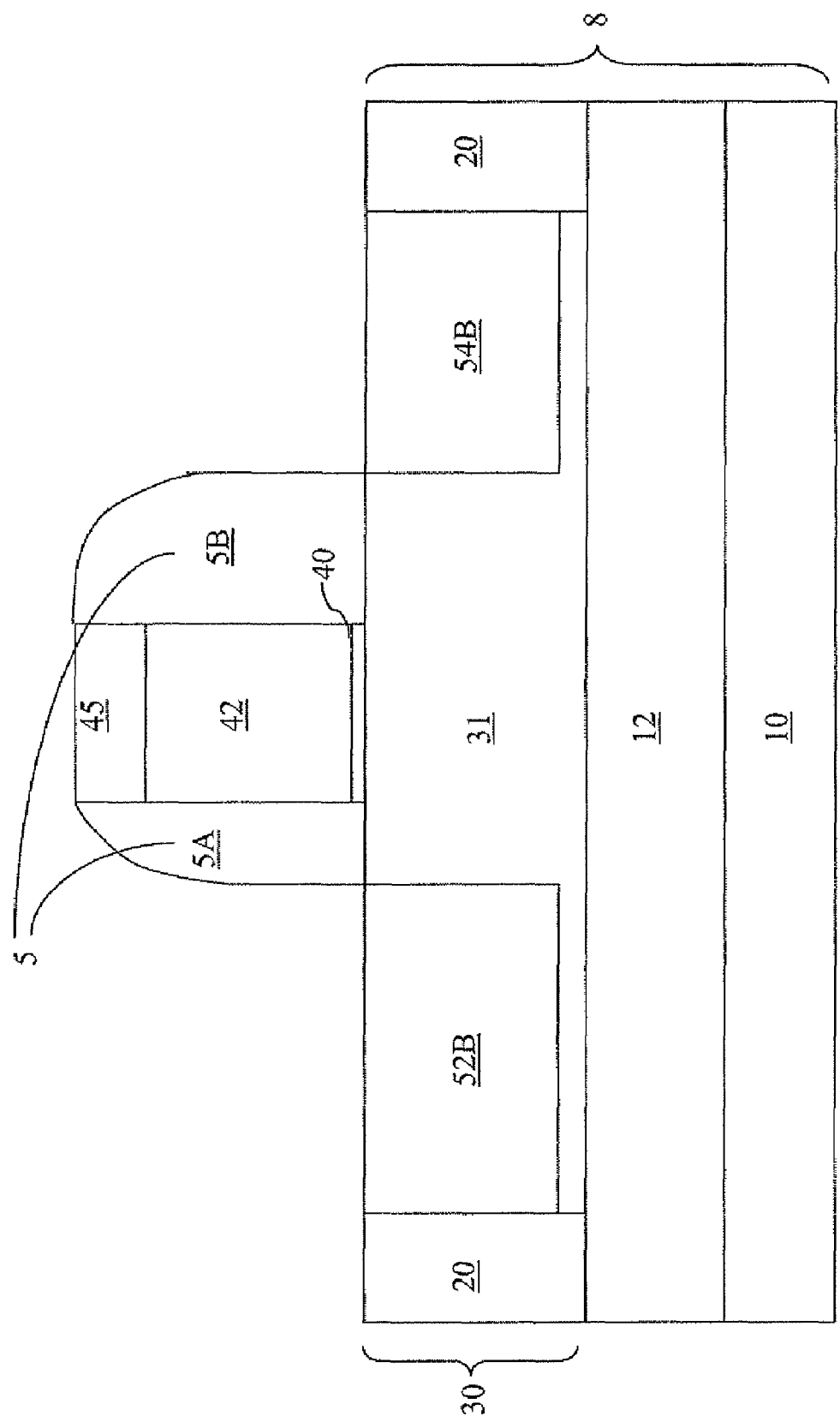

Referring to FIG. 5, a second semiconductor material is deposited in the source trench ST and in the drain trench to form a source side second semiconductor material region 52B and a drain side second semiconductor material region 54B. The second semiconductor material comprises a material having a narrower band gap than the first semiconductor material. In one embodiment, the first semiconductor material comprises silicon and the second semiconductor material comprises a silicon germanium alloy. In another exemplary embodiment, the first semiconductor material comprises GaAs and the second semiconductor material comprises $Ga_{1-x}A_xAs$, wherein A is an acceptor element contributing at least one hole in a valence band and inducing a reduction in the band gap of the GaAs material by replacement of Ga atoms. The value of w may be in the range from 0 to 1. In case the acceptor element A is a group III element, the value of x is the same as the value of w. In case the acceptor element A is a group TI element, the value of x is one half of the value of w. In yet another exemplary embodiment, the first semiconductor material comprises GaAs and the second semiconductor material comprises $GaAs_{1-y}D_z$, wherein D is a donor element contributing at least one electron in a conduction band and inducing a reduction in the band gap of the GaAs material by replacement As atoms. The value of y may be in the range from 0 to 1. In case the donor element D is a group V element, the value of z is the same as the value of y. In case the donor element D is a group VI element, the value of z is one half of the value of y.

The second semiconductor material as deposited may be substantially intrinsic, i.e., free of electrical dopants, or may have a doping of the first conductivity type at a doping level on par with the first semiconductor material region 31.

Preferably, each of the source side second semiconductor material region 52B and the drain side second semiconductor material region 54B is single crystalline and epitaxially aligned to the first semiconductor material region 31. Preferably, selective epitaxy process is employed for the formation of the source side second semiconductor material region 52B and the drain side second semiconductor material region 54B to prevent deposition of the second semiconductor material on dielectric surfaces such as the unimplanted gate cap dielectric 45, the asymmetric disposable spacer 5, and the shallow trench isolation 20. In one embodiment, the source side second semiconductor material region 52B and the drain side second semiconductor material region 54B may be overgrown by a selective epitaxy process above the top surface of the top semiconductor layer 30 and recessed so that top surfaces of the source side second semiconductor material region 52B and the drain side second semiconductor material region 54B are substantially flush with a bottom surface of the gate dielectric 40. In another embodiment, the source side second semiconductor material region 52B and the drain side second semiconductor material region 54B may be grown by the selective epitaxy process up to a level that is substantially flush with a bottom surface of the gate dielectric 40.

Figure 6:
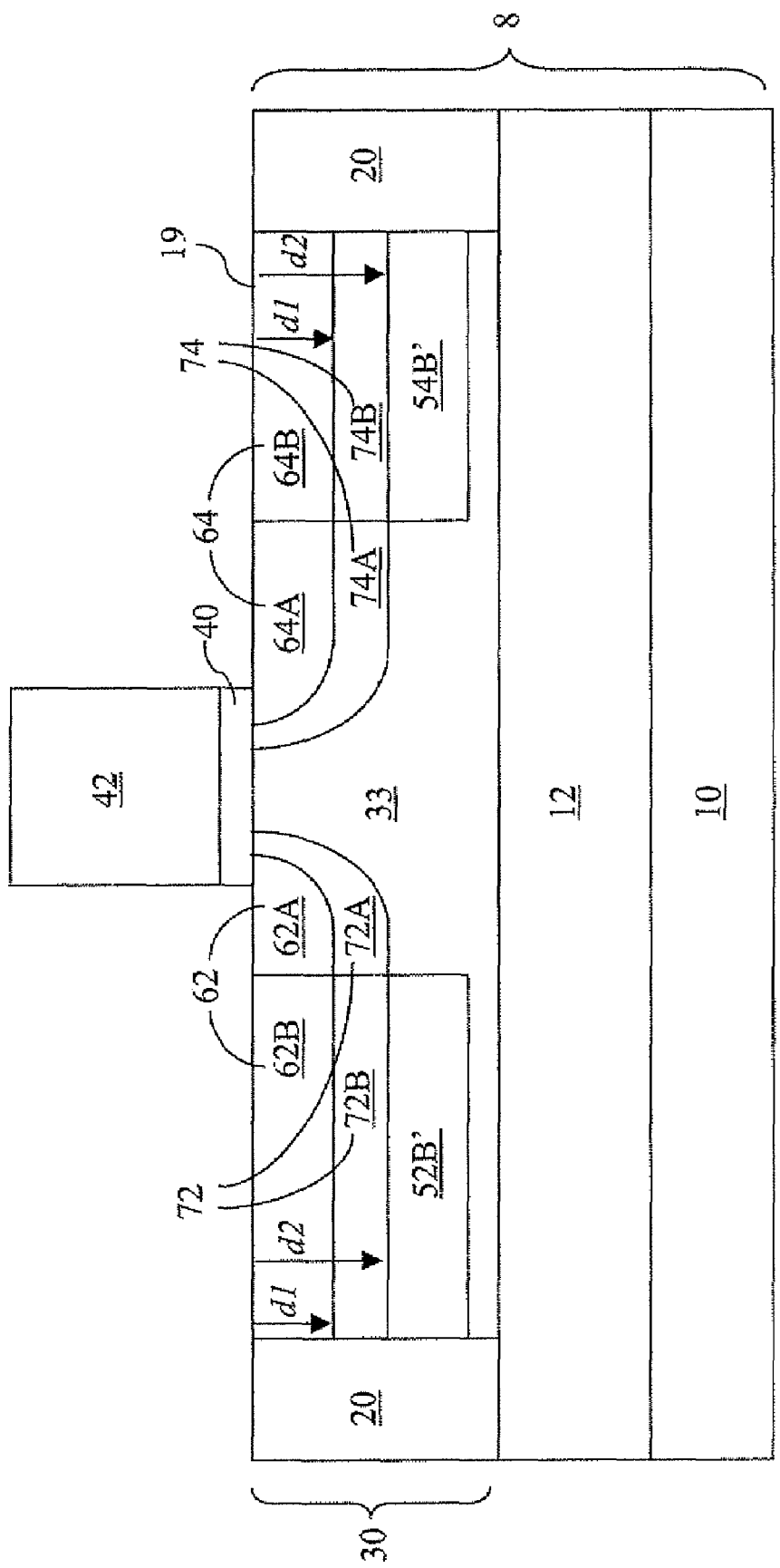

Referring to FIG. 6, the asymmetric disposable spacer 5 is removed selective to the gate conductor 42, the gate dielectric 40, and the shallow trench isolation 20 by a selective etch. The unimplanted gate cap dielectric 45 may also be removed at this step. In one exemplary embodiment, the gate conductor 42, the gate dielectric 40, and the shallow trench isolation 20 comprise silicon oxide, the unimplanted gate cap dielectric 45 and the asymmetric disposable spacer 5 comprise silicon nitride, and the selective etch may be a wet etch employing hot phosphoric acid so that silicon nitride is etched selective to silicon oxide.

A source and drain extension implantation is performed into the top semiconductor layer 30 employing the gate conductor 42 as an implantation mask. The source and drain extension implantation implants dopants of a second conductivity type to form a source extension region 62 and a drain extension region 64. The second conductivity type is the opposite of the first conductivity type, i.e., in case the first conductivity type is p-type, the second conductivity type is n-type and vice versa. The dose of the source and drain extension implantation is sufficient to change the net doping of the source extension region 62 and a drain extension region 64 into a second conductivity type doping. In other words, the source extension region 62 and a drain extension region 64 have the opposite type of doping compared with the first semiconductor material region 31 (See FIG. 5). The source and drain extension implantation may be angled in the plane perpendicular to the direction of the gate conductor 42, i.e., in the plane of the vertical cross-section of FIG. 6, by an angle from 0 degree to about 20 degrees from a vertical axis. Typically, the source extension region 62 and the drain extension region 64 are formed in the top semiconductor layer 30 during a same processing step.

A halo implantation may be performed into the top semiconductor layer 30 employing the gate conductor 42 as an implantation mask. The halo implantation implants dopants of the first conductivity type to form a source side halo region 72 and a drain side halo region 74. The halo implantation is typically angled in the plane perpendicular to the direction of the gate conductor 42, i.e., in the plane of the vertical cross-section of FIG. 6, to deliver first conductivity type dopants beneath edges of the gate conductor 42. The tilt angle of the halo implantation may be from about 5 degrees to about 60 degrees from a vertical axis, and typically from about 10 degrees to about 30 degrees. Typically, the source side halo region 72 and the drain side halo region 74 are formed in the top semiconductor region 30 during the same processing step.

The source extension region 62 comprises a first semiconductor material source extension region 62A formed within the first semiconductor material region 31 (See FIG. 5) and a second semiconductor material source extension region 62B formed in the source side second semiconductor material region 52B (See FIG. 5). Likewise, the drain extension region 64 comprises a first semiconductor material drain extension region 64A formed within the first semiconductor material region 31 (See FIG. 5) and a second semiconductor material drain extension region 64B formed in the drain side second semiconductor material region 54B (See FIG. 5). The source extension region 62 and the drain extension region 64 have a first depth d1 from the top surface 19 of the top semiconductor layer 30. The first depth d1 is less than the depth of trench D_t. The first depth d1 may be from about 5 nm to about 50 nm, although lesser and greater depths are also contemplated herein. The source extension region 62 and the drain extension region 64 are formed directly beneath the top surface 19 of the top semiconductor layer 30, i.e., abuts the top surface 19 of the top semiconductor layer 30.

The source side halo region 72 comprises a first semiconductor material source side halo region 72A formed within the first semiconductor material region 31 (See FIG. 5) and a second semiconductor material source side halo region 72B formed in the source side second semiconductor material region 52B (See FIG. 5). Likewise, the drain side halo region 74 comprises a first semiconductor material drain side halo region 74A formed within the first semiconductor material region 31 (See FIG. 5) and a second semiconductor material drain side halo region 74B formed in the drain side second semiconductor material region 54B (See FIG. 5). The source side halo region 72 and the drain side halo region 74 have a second depth d2 from the top surface 19 of the top semiconductor layer 30. The first semiconductor material source side halo region 72A and the first semiconductor material drain side halo region 74A abuts the gate dielectric 40. The second depth d2 is greater than the first depth d1 and is less than the depth of trench D_t. The second depth d2 may be from about 10 nm to about 100 nm, although lesser and greater depths are also contemplated herein.

The remaining portion of the first semiconductor material region 31, i.e., the portion of the first semiconductor material region 31 that is not implanted by ions during the source and drain extension implantation and the halo implantation, constitute a first semiconductor material body 33 having the same doping as the first semiconductor material region 31 prior to the source and drain extension implantation and the halo implantation. The remaining portion of the source side second semiconductor material region 52B (See FIG. 5), i.e., the portion of the source side second semiconductor material region 52B that is not implanted by ions during the source and drain extension implantation and the halo implantation, constitutes an unimplanted source side second semiconductor material region 52B'. Likewise, the remaining portion of the drain side second semiconductor material region 54B (See FIG. 5) constitutes an unimplanted drain side second conductor material region 54B'.

The source extension region 62 and the drain extension region 64 may have a doping concentration from about $1.0\times10^{19}$ atoms/cm$^3$ to about $1.0\times10^{21}$ atoms/cm$^3$, while lesser and greater doping concentrations are also contemplated herein. Typical doping concentration of the source side halo region 72 and the drain side halo region 74 may be from about $1.0\times10^{17}$ atoms/cm$^3$ to about $1.0\times10^{2}$ atoms/cm$^3$, while lesser and greater doping concentrations are also contemplated herein. The first semiconductor material body 33 has a doping of the first conductivity type and has the original doping concentration of the semiconductor region 29 (See FIG. 1). For example, the first semiconductor material body 33 may have a doping concentration from about $1.0\times10^{15}$ atoms/cm$^3$ to about $1.0\times10^{19}$ atoms/cm$^3$. The doping concentration of the source side halo region 72 and the drain side halo region 74 is higher than the doping concentration of the first semiconductor material body 33.

Figure 7:
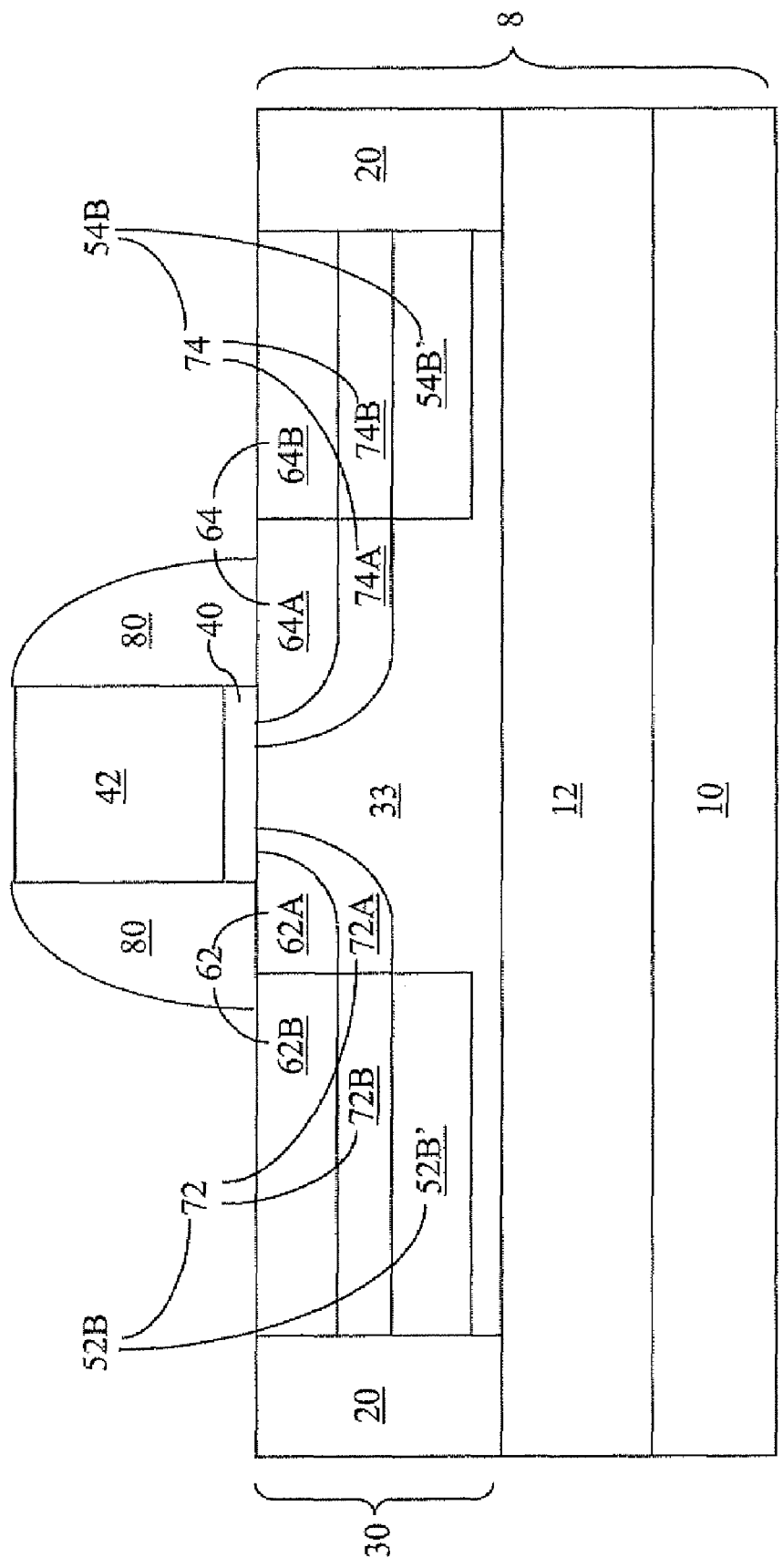

Referring to FIG. 7, a gate spacer layer (not shown) is conformally deposited and etched in a reactive ion etch to form a gate spacer 80. The gate spacer 80 comprises a dielectric material such as silicon oxide, silicon nitride, silicon oxynitride, or a stack thereof. The gate spacer 80 may include a low-k dielectric material. The gate spacer 80 has a two-fold symmetry about a vertical plane located in the gate middle of the gate conductor 42 and parallel to the direction of the gate conductor 42. The thickness of the gate spacer 80, as measured laterally at the base of the gate spacer 80, is the same when measure on the side of the source side second semiconductor material region 52B as when measured on the side of the drain side second semiconductor material region 54B. The thickness of the gate spacer may be from about 10 nm to about 100 nm, and typically from about 20 nm to about 80 nm.

It is understood that the gate spacer 80 may comprise a set of multiple component gate spacers having different compositions and/or formed at different processing steps. Further, the source and drain extension ion implantation and/or the halo implantation may be performed after formation of at least one component gate spacer and prior to at least another component gate spacer. The gate spacer 80 refers to a complete set of component gate spacers.

Figure 8:
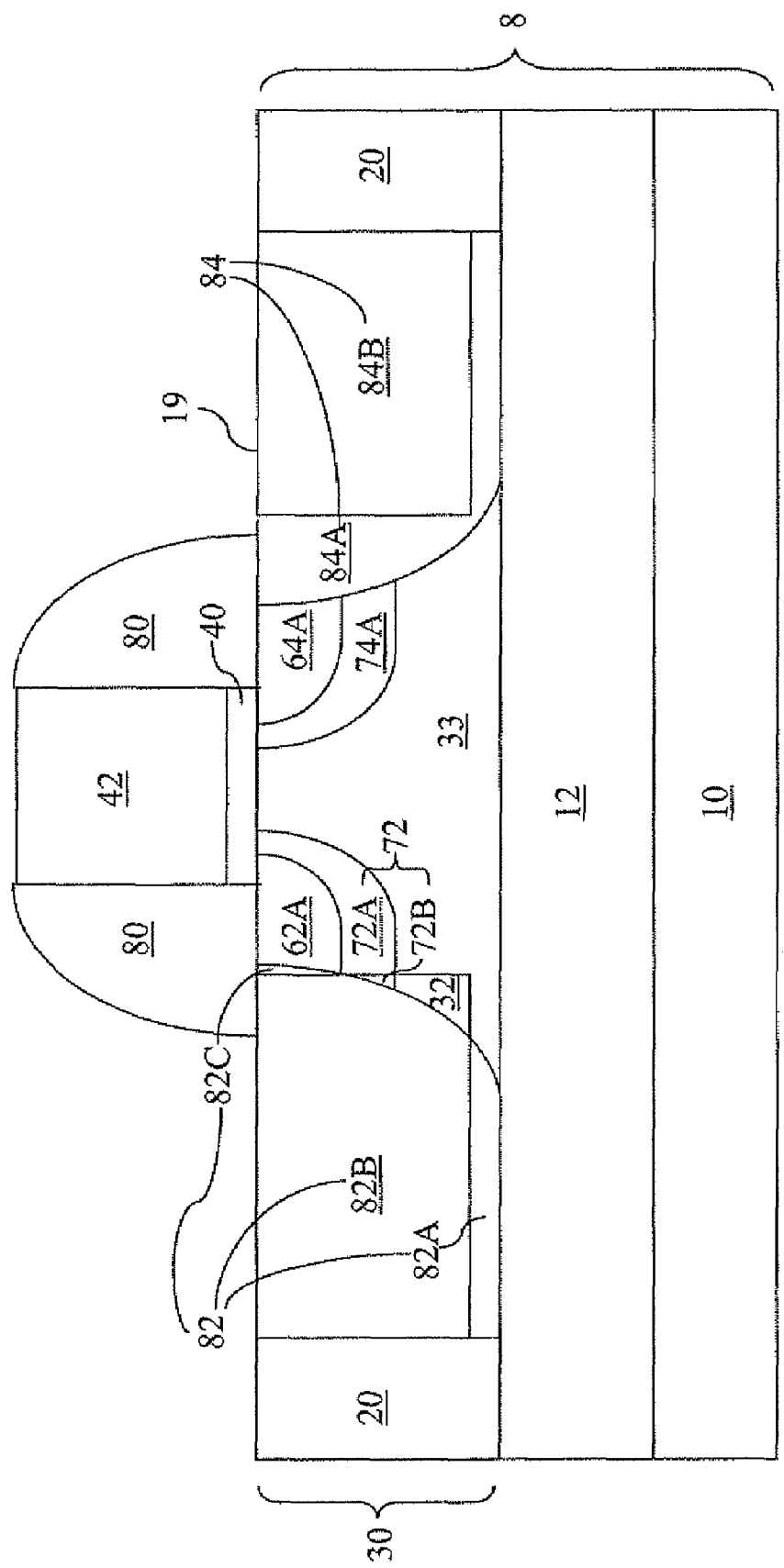

Referring to FIG. 8, a source and drain ion implantation is performed to form a source region 82 and a drain region 84. Dopants of the second conductivity type are implanted into the top semiconductor layer 30. The energy of the source and drain ion implantation is adjusted so that the source region 82 and the drain region 84 extend to the bottom of the top semiconductor layer 30, i.e., the source region 82 and the drain region 84 abut the buried insulator layer 12. The dose of the source and drain ion implantation delivers second conductivity type dopants into the source region 82 and the drain region 84 at a doping concentration greater than the doping concentrations of the second semiconductor material source side halo region 72B, the second semiconductor material drain side halo region 74B, the unimplanted source side second semiconductor material region 52B', the unimplanted drain side second semiconductor material region 54B', and the first semiconductor material body 33. Therefore, all portions of the source region 82 and the drain region 84 have a doping of the second conductivity type. The doping concentration of the source region 82 and the drain region 84 may be from about $3.0\times10^{19}$ atoms/cm$^3$ to about $3.0\times10^{21}$ atoms/cm$^3$, while lesser and greater doping concentrations are also contemplated herein.

The source region 82 comprises a second semiconductor material source region 82B, a bottom first semiconductor material source region 82A, and a top first semiconductor material source region 82C. The second semiconductor material source region 82B is formed in the source side second semiconductor material region 52B (See FIG. 7). The bottom first semiconductor material source region 82A contains the first semiconductor material and vertically abuts the buried insulator layer 12 and the second semiconductor material source region 82B. The top first semiconductor material source region 82C contains the first semiconductor material and laterally abuts the second semiconductor material source region 82B and vertically abuts the top surface 19 of the top semiconductor layer 30.

The second semiconductor material source side halo region 72B is reduced in size as the portion of the second semiconductor material source side halo region 72B that is implanted with the second conductivity type dopants during the source and drain implantation becomes a portion of the second semiconductor material source region 82B. The portion of the unimplanted source side second semiconductor material region 52B' (See FIG. 7) that is not implanted by the second conductivity type dopants during the source and drain implantation constitutes a second semiconductor material body 32, which has a doping of the first conductivity type.

The drain region 84 comprises a second semiconductor material drain region 84B and a first semiconductor material drain region 84A. The second semiconductor material drain region 84B is formed out of and has the same volume as the drain side second semiconductor material region 54B (See FIG. 7). The first semiconductor material drain region 84A contains the first semiconductor material and vertically abuts the buried insulator layer 12 and the top surface 19 of the top semiconductor layer 30. The first semiconductor material drain region 84A separated the second semiconductor material drain region 84 from the first semiconductor material body 33, i.e., the second semiconductor material drain region 84 is disjoined from the first semiconductor material body 33 by the first semiconductor material drain region 84A.

Figure 9:
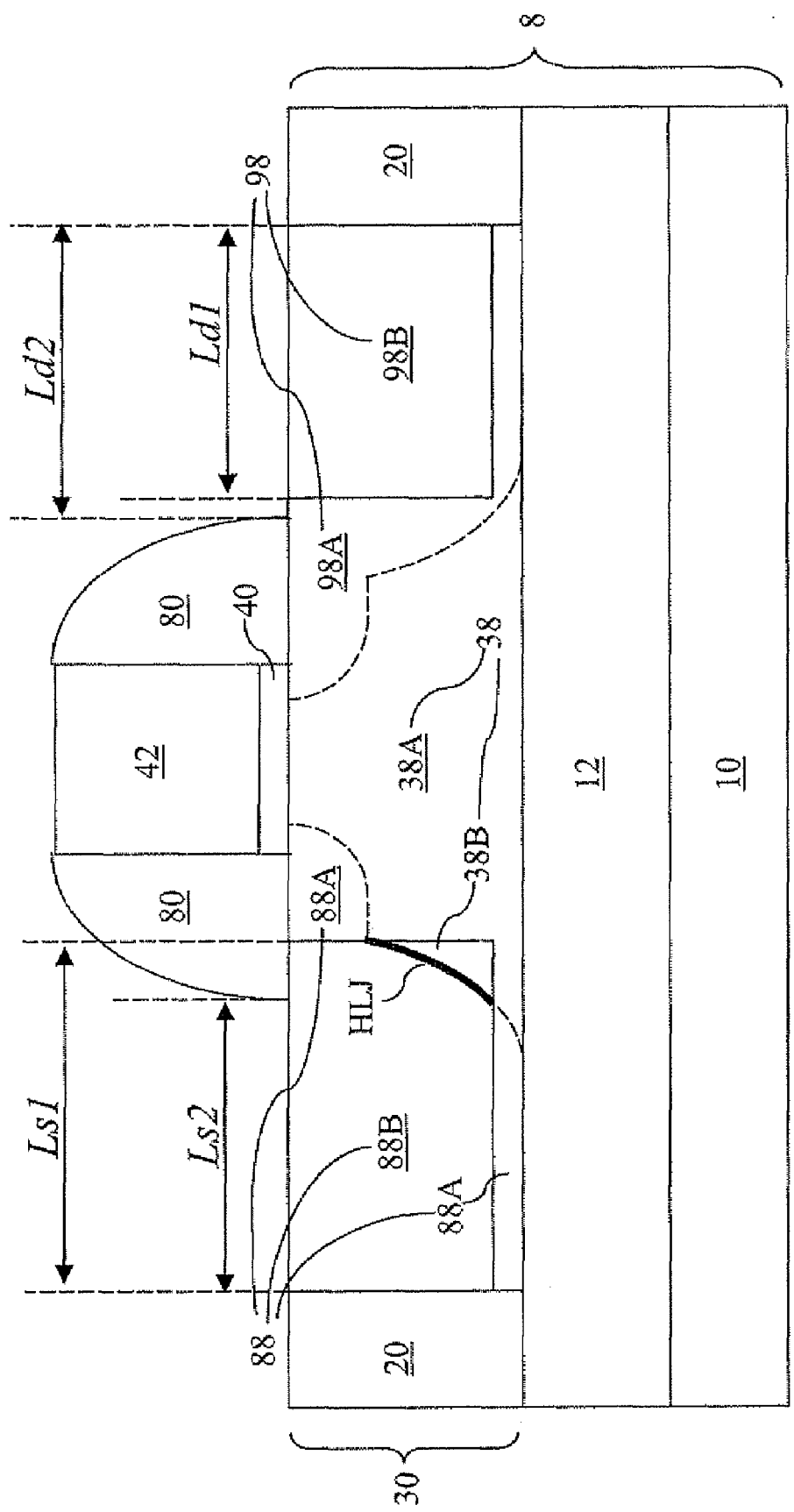

In FIG. 9, another view of the first exemplary semiconductor structure in FIG. 8 is shown to show semiconductor regions that are electrically connected. An extended body region 38 comprises a first semiconductor material extended body region 38A and a second semiconductor material extended body region 38B. The entire extended body region 38 has a doping of the first conductivity type. The entire first semiconductor material extended body region 38A comprises the first semiconductor material, and the entire second semiconductor material extended body region 38B comprises the second semiconductor material. The first semiconductor material extended body region 38A comprises the first semiconductor material source side halo region 72A, the first semiconductor material drain side halo region 74A, and the first semiconductor material body 33 (See FIG. 8). The second semiconductor material extended body region 38B comprises the second semiconductor material source side halo region 72B and the second semiconductor material body. All portions of the extended body region 38 are electrically connected.

An extended source region 88 comprises a first semiconductor material extended source region 88A and a second semiconductor material extended source region 88B. The entire extended source region 88 has a doping of the second conductivity type. The first semiconductor material extended source region 88A comprises the bottom first semiconductor material source region 82A, the top first semiconductor material source region 82C, and the first semiconductor material source extension region 62A (See FIG. 8). The second semiconductor material extended source region 88B comprises the second semiconductor material source region 82B. All portions of the extended source region 88 are electrically connected.

The extended drain region 98 comprises a first semiconductor material extended drain region 98A and a second semiconductor material extended drain region 98B. The entire extended drain region 88 has a doping of the second conductivity type. The first semiconductor material extended drain region 98A comprises the first semiconductor material drain region 84A and the first semiconductor material drain extension region 64A (See FIG. 8). The second semiconductor material extended drain region 98B comprises the second semiconductor material drain region 84B. All portions of the extended drain region 98 are electrically connected.

A portion of the interface between the extended body region 38 and the extended source region 88 is located within the source side second semiconductor material region 52B (See FIG. 7) comprising the second semiconductor material. Since the second semiconductor material has a narrower band gap that the first semiconductor material, leakage current density across the portion of the interface within the source side second semiconductor material region 52B is much higher than leakage current density across the remainder of the interface between the extended body region 38 and the extended source region 88. Thus, the portion of the interface within the source side second semiconductor material region 52B and comprising the second semiconductor material is a high leakage junction HLJ, which is marked with a bold line in FIG. 9. The remaining portion of the interface between the extended body region 38 and the extended source region 88 is a low leakage junction comprising the first semiconductor material. Further, the interface between the extended body region 38 and the extended drain region 98 is also a low leakage junction. The low leakage junctions are marked with dotted lines in FIG. 9.

The high leakage junction allows charges in the extended body region 38A to leak into the extended source region 88. Therefore, the extended body region 38A continually loses charges that may be generated during operation of the inventive SOI MOSFET. By reducing the charge in the extended body region, floating body effects are reduced or eliminated in the inventive SOI MOSFET.

A source side length Ls2, which is the lateral distance between an outer edge of the extended source region 88 abutting the shallow trench isolation 20 and an outer edge of the gate spacer 80 on the side of the extended source region 88 at the top surface 19 of the top semiconductor layer 30, is less than the source trench length Ls1. A drain side length Ld2, which is the lateral distance between an outer edge of the extended drain region 98 abutting the shallow trench isolation 20 and an outer edge of the gate spacer 80 on the side of the extended drain region 98 at the top surface 19 of the top semiconductor layer 30, is greater than the drain trench length Ld1. In one embodiment, the source side length Ls2 and the drain side length Ld2 are substantially the same and is a minimum width necessary for forming a metal contact via.

Figure 10:
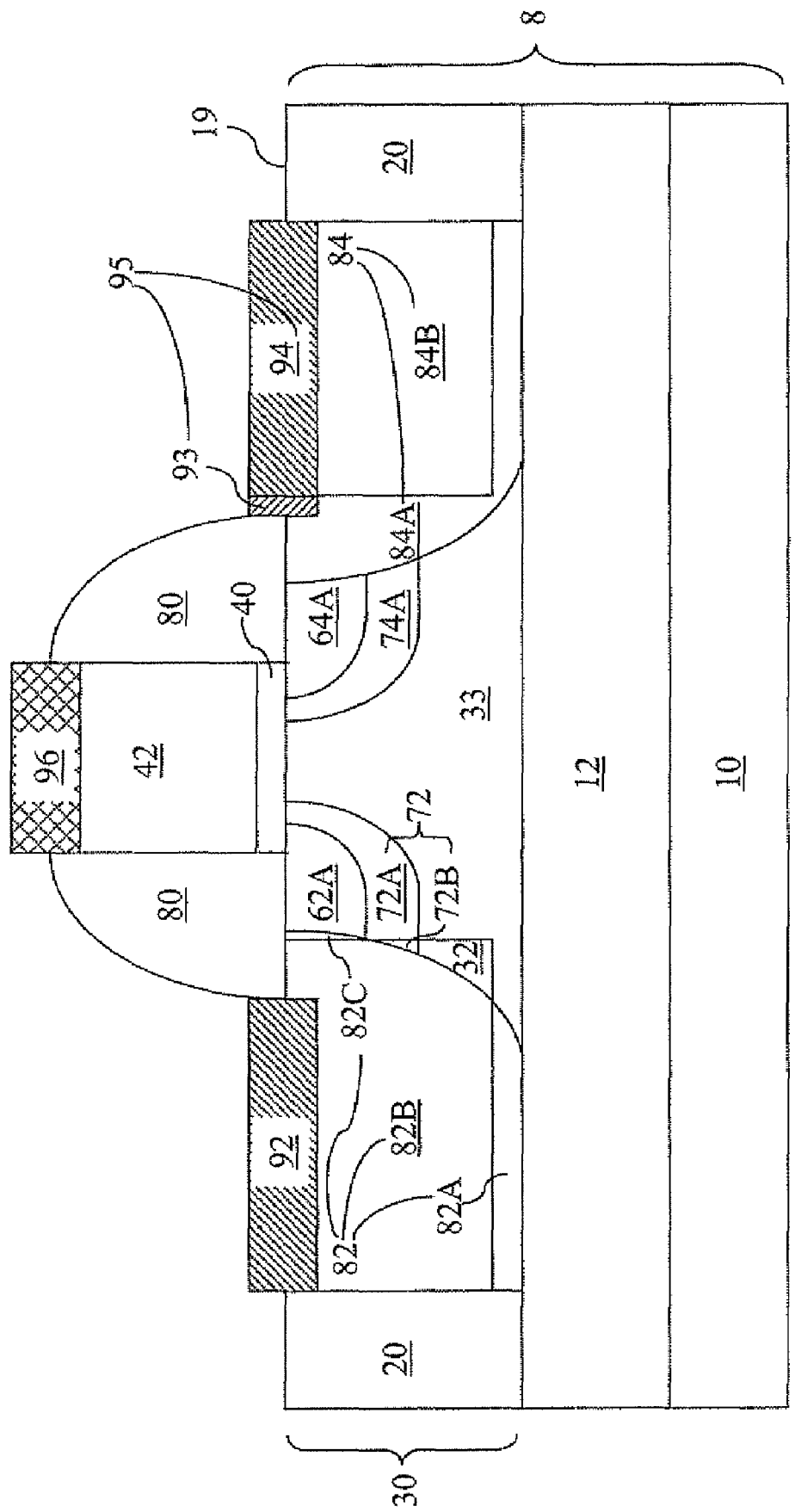

Referring to FIG. 10, a source metal semiconductor alloy 92, a drain metal semiconductor alloy 95, and optionally, a gate metal semiconductor alloy 96 are formed by metallization of exposed semiconductor material. To complete the metallization, a metal layer (not shown) may be deposited directly on the top semiconductor layer 30 and the gate conductor 42, for example, by a blanket deposition. The metal layer comprises a metal capable of forming a metal semiconductor alloy with the first semiconductor material, the second semiconductor material, and the semiconductor material of the gate conductor 42. For example, the metal may be tungsten, tantalum, titanium, cobalt, nickel, platinum, osmium, another elemental metal, or an alloy thereof.

A preferred thickness of the metal layer ranges from about 5 nm to about 50 nm, more preferably from about 10 nm to about 25 nm. The metal layer can be readily deposited by any suitable deposition technique, including, but not limited to: atomic layer deposition (ALD), chemical vapor deposition (CVD), and physical vapor deposition (PVD). Optionally, a metal nitride capping layer (not shown) may be deposited over the metal layer. The metal nitride capping layer may contain a refractory metal nitride such as TaN, TiN, OsN and has a thickness ranging from about 5 nm to about 50 nm, preferably from about 10 nm to about 30 nm.

The first exemplary semiconductor structure is thereafter annealed at a predetermined elevated temperature at which the metal layer reacts with the second semiconductor material source region 82B to form the source metal semiconductor alloy 92. The metal layer also reacts with the second semiconductor material drain region 84B to form a second drain metal semiconductor alloy 94. At the same time, the metal layer reacts with the first semiconductor material drain region 84A to form a first drain metal semiconductor alloy 93. The source metal semiconductor alloy 92 and the second drain metal semiconductor alloy 94 are metallized alloys of the second semiconductor material with the metal layer, while the first drain metal semiconductor alloy 93 is a metallized alloy of the first semiconductor material with the metal layer. The drain metal semiconductor alloy 95 comprises the first drain metal semiconductor alloy 93 and the second drain metal semiconductor alloy 94.

The gate metal semiconductor alloy 96 is formed in case the gate conductor 42 comprises a material that reacts with the metal layer to form a metallized alloy. In one embodiment, the gate conductor 42 may comprise a semiconductor material that may form a metal semiconductor alloy when reacted with the metal layer. In another embodiment, the gate conductor 42 may have a metallic composition that does not react with the metal layer. In this case, the gate metal semiconductor alloy 96 is not formed.

The source metal semiconductor alloy 92 is homogeneous, i.e., has the same composition throughout. The drain metal semiconductor alloy 95 is heterogeneous since the source metal semiconductor alloy 92 and the second drain metal semiconductor alloy 94 have different compositions. However, the source metal semiconductor alloy 92 and the second drain metal semiconductor alloy 94 are derived from the same metal, i.e., the metal of the metal layer employed in the metallization process. After the metallization process, unreacted portions of the metal layer are removed, for example, by a wet etch.

The vertical thickness of the source metal semiconductor alloy 92 and the drain metal semiconductor alloy 95 may be from about 10 nm to about 60 nm, and typically from bout 20 nm to about 40 nm, although lesser and greater thicknesses are also contemplated. The gate metal semiconductor alloy 96 has a comparable thickness.

A middle-of-line (MOL) dielectric layer (not shown) is formed on the gate spacer 80, the source metal semiconductor alloy 92, the drain metal semiconductor alloy 95, and the shallow trench isolation 20, and/or the gate metal semiconductor alloy 96. The MOL dielectric layer may comprise a silicon oxide, a silicon nitride, a chemical vapor deposition (CVD) low-k dielectric material, a spin-on low-k dielectric material, or a stack thereof. The MOL dielectric layer may contain a mobile ion diffusion barrier layer that prevents diffusion of mobile ions such as sodium and potassium from back-end-of-line (BEOL) dielectric layers. Further, the MOL dielectric layer may contain a stress liner that applies tensile or compressive stress on underlying structures to alter charge carrier mobility in a portion of the top semiconductor layer 30 such as a channel (not shown) in the extended body region 38 (See FIG. 9) of the inventive SOI MOSFET.

Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

Contact via holes are formed in the MOL dielectric layer and filled with metal to form various metal contacts. Specifically, a source contact via (not shown) is formed directly on the source metal semiconductor alloy 92 and a drain contact via (not shown) is formed directly on the drain metal semiconductor alloy 95 may be formed.

Figure 11:
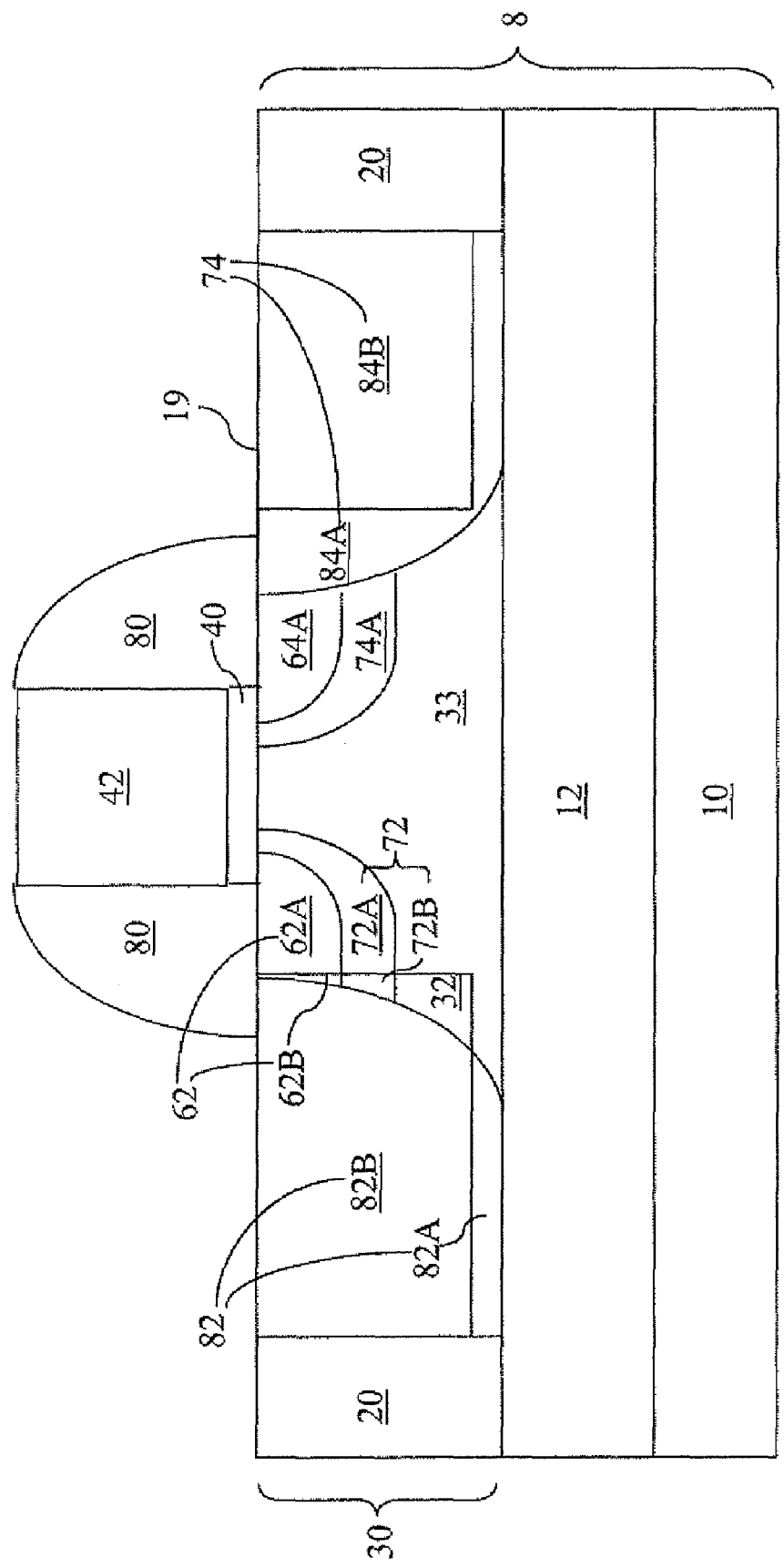
FIGS. 11-12 are sequential vertical cross-sectional views of a second exemplary semiconductor structure according to the present invention.

Referring to FIG. 11, a second exemplary semiconductor structure is derived from a variation of the first exemplary semiconductor structure in FIG. 7, in which the gate spacer 80 has a greater lateral thickness. During the source and drain implantation step described above, the lateral extent of the source region 82 does not reach into the first semiconductor material source extension region 62A. Thus, a top first semiconductor material source region 82C is not formed in the second exemplary semiconductor structure. Instead, a portion of the second semiconductor material source extension region 62B, which is formed during the source and drain extension implantation step in FIG. 6, still remains outside the source region 82, albeit in a reduced size.

Thus, the source region 82 comprises the bottom first semiconductor material source region 82A and the second semiconductor material source region 82B. The source extension region 62 comprises the first semiconductor material source extension region 62A formed within the first semiconductor material region 31 (See FIG. 5) and the second semiconductor material source extension region 62B formed in the source side second semiconductor material region 52B (See FIG. 5).

Figure 12:
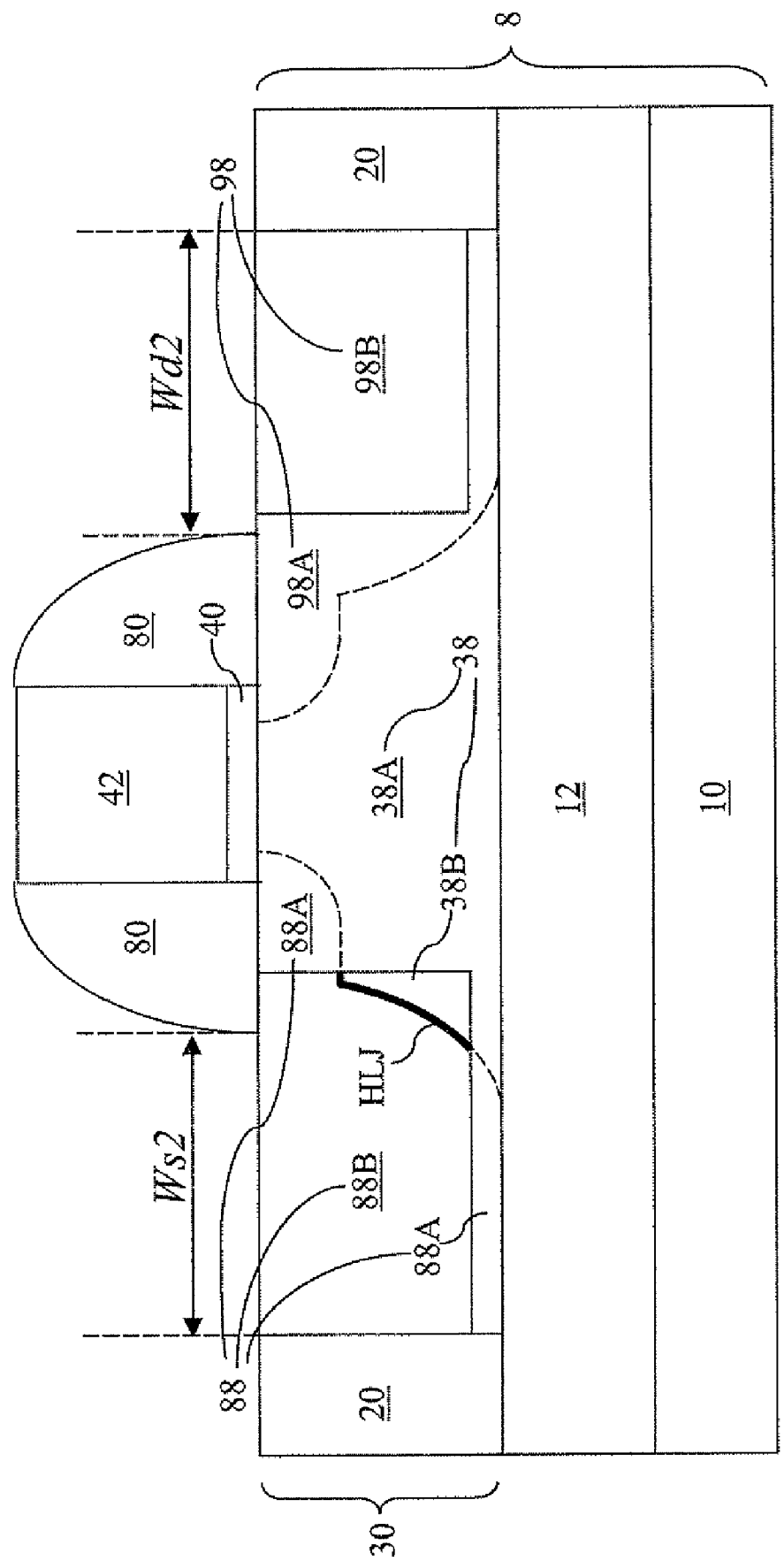

Referring to FIG. 12, another view of the second exemplary semiconductor structure in FIG. 118 is shown to show semiconductor regions that are electrically connected. An extended body region 38 comprises a first semiconductor material extended body region 38A and a second semiconductor material extended body region 38B. The entire extended body region 38 has a doping of the first conductivity type. The entire first semiconductor material extended body region 38A comprises the first semiconductor material, and the entire second semiconductor material extended body region 38B comprises the second semiconductor material. The first semiconductor material extended body region 38A comprises the same components as in the first exemplary semiconductor structure. The second semiconductor material extended body region 38B comprises the same components as in the first exemplary semiconductor structure. All portions of the extended body region 38 are electrically connected.

An extended source region 88 comprises a first semiconductor material extended source region 88A and a second semiconductor material extended source region 88B. The entire extended source region 88 has a doping of the second conductivity type. The first semiconductor material extended source region 88A comprises the bottom first semiconductor material source region 82A and the first semiconductor material source extension region 62A (See FIG. 11). The second semiconductor material extended source region 88B comprises the second semiconductor material source region 82B and the second semiconductor material source extension region 62B. All portions of the extended source region 88 are electrically connected.

The same processing steps are subsequently employed on the second exemplary semiconductor structure as on the first exemplary semiconductor structure as described above.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a top semiconductor layer located in a substrate;
an extended body region including a first semiconductor material extended body portion containing a first semiconductor material and a second semiconductor material extended body portion containing a second semiconductor material, located in said top semiconductor layer, and having a first conductivity type doping, wherein said second semiconductor material has a narrower band gap than said first semiconductor material;
a gate dielectric vertically abutting said first semiconductor material body portion;
a gate electrode vertically abutting said gate dielectric; and
an extended source region containing a second semiconductor material source region comprising said second semiconductor material and having a second conductivity type doping, wherein said second conductivity type is the opposite of said first conductivity type, and wherein said second semiconductor material source region abuts said second semiconductor material body portion.

2. The semiconductor structure of claim 1, wherein said substrate is a semiconductor-on-insulator layer comprising said top semiconductor layer, a buried insulator layer vertically abutting said top semiconductor layer, and a handle substrate vertically abutting said buried insulator layer, and wherein said extended source region further comprises a bottom first semiconductor material source region containing said first semiconductor material and vertically abutting said buried insulator layer and said second semiconductor material source region.

3. The semiconductor structure of claim 2, wherein said extended source region further comprises a top first semiconductor material source region containing said first semiconductor material and laterally abutting said second semiconductor material source region and vertically abutting a top surface of said top semiconductor layer.

4. The semiconductor structure of claim 3, wherein said extended source region further comprises a first semiconductor material source extension region containing said first semiconductor material and abutting said top first semiconductor material source region and vertically abutting said top surface of said top semiconductor layer.

5. The semiconductor structure of claim 2, wherein said extended source region further comprises a second semiconductor material source extension region containing said second semiconductor material and abutting said second semiconductor material source region and vertically abutting said extended body region.

6. The semiconductor structure of claim 5, wherein said extended source region further comprises a first semiconductor material source extension region containing said first semiconductor material and laterally abutting said second semiconductor material source extension region and vertically abutting a top surface of said top semiconductor layer.

7. The semiconductor structure of claim 1, further comprising an extended drain region containing a first semiconductor material drain region and a second semiconductor material drain region, wherein said first semiconductor material drain region contains said first semiconductor material and abuts said extended body region, and wherein said second semiconductor material drain region contains said second semiconductor material and is separated from said extended body region by said first semiconductor material drain region.

8. The semiconductor structure of claim 1, further comprising a gate spacer containing a dielectric material, wherein said gate spacer abuts said second semiconductor material source region on one side of said gate electrode, and wherein said gate spacer is disjoined from any second semiconductor material on an opposite side of said gate electrode.

9. The semiconductor structure of claim 8, further comprising an extended drain region containing a first semiconductor material drain region and a second semiconductor material drain region, wherein said first semiconductor material drain region contains said first semiconductor material and abuts said gate spacer, and wherein said second semiconductor material drain region contains said second semiconductor material and is separated from gate spacer.

10. The semiconductor structure of claim 1, wherein said extended body region comprises a source side halo region and a drain side halo region, wherein said source side halo region includes a first semiconductor material source side halo region containing said first semiconductor material and a second semiconductor material source side halo region containing said second semiconductor material, and wherein said drain side halo region contains said first semiconductor material.

11. The semiconductor structure of claim 10, wherein said first semiconductor material extended body portion comprises said first semiconductor material source side halo region, and wherein said second semiconductor material extended body portion comprises said second semiconductor material source side halo region.

12. The semiconductor structure of claim 11 wherein said second semiconductor material extended body portion further comprises a second semiconductor material body region vertically abutting said second semiconductor material source side halo region.

13. The semiconductor structure of claim 1, further comprising:
a first semiconductor material source extension region comprising said first semiconductor material located in said source extension region and having a first depth from a top surface of said top semiconductor layer;
a first semiconductor material source extension region comprising said first semiconductor material located in said top semiconductor layer and having said first depth from said top surface of said top semiconductor layer;
a source side halo region located in said extended body region and having a second depth from said top semiconductor layer, wherein said second depth is greater than said first depth; and
a drain side halo region located in said extended body region and having said second depth from said top semiconductor layer.

* * * * *